US010095249B2

(12) United States Patent
Meijer et al.

(10) Patent No.: US 10,095,249 B2
(45) Date of Patent: *Oct. 9, 2018

(54) LOCALIZED COMPUTER SYSTEM HUMIDITY CONTROL

(71) Applicant: International Business Machines Corporation, Armonk, NY (US)

(72) Inventors: Ingmar G. Meijer, Zurich (CH); Patrick Ruch, Jenins (CH)

(73) Assignee: International Business Machines Corporation, Armonk, NY (US)

(*) Notice: Subject to any disclaimer, the term of this patent is extended or adjusted under 35 U.S.C. 154(b) by 195 days.

This patent is subject to a terminal disclaimer.

(21) Appl. No.: 14/984,420

(22) Filed: Dec. 30, 2015

(65) Prior Publication Data

US 2016/0310890 A1    Oct. 27, 2016

Related U.S. Application Data

(63) Continuation of application No. 14/697,292, filed on Apr. 27, 2015.

(51) Int. Cl.
*G05D 22/02* (2006.01)
*F24F 3/14* (2006.01)
(Continued)

(52) U.S. Cl.
CPC ......... *G05D 22/02* (2013.01); *B01D 53/0454* (2013.01); *B01D 53/261* (2013.01);
(Continued)

(58) Field of Classification Search
CPC ....... G05D 22/00; G05D 22/02; F25F 3/1411; H05K 5/0213; H05K 7/20836;
(Continued)

(56) References Cited

U.S. PATENT DOCUMENTS 8,346,398 B2   1/2013   Ahmed
8,483,996 B2   7/2013   Patel
(Continued)

FOREIGN PATENT DOCUMENTS

CN    102305447    1/2012

OTHER PUBLICATIONS

Tony Evans. Humidification strategies for data centers and network rooms. Schneider Electric—Data Center Science Center, White Paper 58, Revision 2, 2004-2008, pp. 1-14.
(Continued)

*Primary Examiner* — Marc Norman
(74) *Attorney, Agent, or Firm* — Daniel P. Morris; Otterstedt, Ellenbogen & Kammer, LLP (57) ABSTRACT

An air moisture control system for a computer system includes a housing with an air passage and an air moisture control element with an adsorption material, which is exposed in the air passage so as to enable fluid communication towards and from the air moisture control element. The element is designed such that the adsorption material is adapted, in operation, to adsorb moisture from a first air flow flowing into the air passage, having a first temperature and a first relative humidity, and desorb moisture to a second air flow, said air flow having a second temperature at least 5° C. higher than the first temperature and a second humidity at least 3% lower than the first relative humidity.

7 Claims, 5 Drawing Sheets

(51) Int. Cl.
*H05K 7/20* (2006.01)
*B01D 53/26* (2006.01)
*H05K 5/02* (2006.01)
*B01D 53/04* (2006.01)

(52) U.S. Cl.
CPC .......... *F24F 3/1411* (2013.01); *H05K 5/0213* (2013.01); *H05K 7/20836* (2013.01); *B01D 53/0446* (2013.01); *B01D 2253/102* (2013.01); *B01D 2253/106* (2013.01); *B01D 2253/108* (2013.01); *B01D 2253/1122* (2013.01); *B01D 2253/204* (2013.01); *B01D 2259/40088* (2013.01)

(58) Field of Classification Search
CPC ............ B01D 53/0446; B01D 53/0454; B01D 53/216; B01D 2253/102; B01D 2253/106; B01D 2253/108; B01D 2253/1122; B01D 2253/204; B01D 2253/40088; F24F 3/1411
See application file for complete search history.

(56) References Cited

U.S. PATENT DOCUMENTS

| | | | |
|---|---|---|---|
| 8,583,289 | B2 | 11/2013 | Stack |
| 9,476,649 | B2 | 10/2016 | Reytblat et al. |
| 2011/0195652 | A1 | 8/2011 | Smith |
| 2013/0025450 | A1 | 1/2013 | Sharma et al. |
| 2014/0150481 | A1 | 6/2014 | Vandermeulen |
| 2016/0007506 | A1 | 1/2016 | Karasawa et al. |

OTHER PUBLICATIONS

Pravin Ganore. How to control relative humidity in data centers. Downloaded from http://www.esds.co.in/kb/how-to-control-relative-humidity-in-data-centers/ on Apr. 9, 2015, pp. 1-2.

Robert F Sty. Humidity control in data centers using air side economizers. Data Center Knowledge, Industry perspectives, Jun. 3, 2014, pp. 1-3.

John Hatcher. Humidity control in the data center. Data center management magazine, Date: Oct. 20, 2011, pp. 1-5.

Anon., EcoCooling Evaporative Cooling, Data center cooling—humidity. Downloaded from http://www.ecocooling.co.uk/datacentre/datacentre_humidity.php on Apr. 10, 2015, pp. 1-3.

Ingmar G. Meijer et al., unpublished U.S. Appl. No. 14/697,292, filed Apr. 27, 2015 Localized Computer System Humidity Control pp. 1-34 plus 5 sheets drawings.

List of IBM Patents or Patent Applications Treated as Related.

LOCALIZED COMPUTER SYSTEM HUMIDITY CONTROL

CROSS-REFERENCE TO RELATED APPLICATION

This application is a continuation of U.S. patent application Ser. No. 14/697,292 filed Apr. 27, 2015, the complete disclosure of which is expressly incorporated herein by reference in its entirety for all purposes.

BACKGROUND

The present invention relates to a moisture control system for a computer system and a computer system. Furthermore, the invention relates to a method for moisture control for a computer system.

Data centers comprise several computer systems. The computer systems require a constant air supply in view of the temperature and the relative humidity. Usually air conditioning systems are used in order to provide a constant air temperature. However, the relative humidity increases by decreasing the temperature of the air. In areas with high temperatures and a high humidity, this may increase the risk of condensation in the computer system or in the data center if the temperature falls under the dew point of the air.

Therefore, moisture control systems are used in order to avoid high humidity in the computer systems or in the data center. Moisture control systems are adapted to control the humidity and dry the air in the data center or the computer system so that condensation is avoided in the data center or the computer system. Furthermore, the moisture control system can be provided with additional filter systems in order to prevent a dust contamination of the computer system.

Usually, a central air handler is provided for a data center or a computer system which supplies all areas of the data center with air having the same temperature and the same humidity. The temperature and the humidity have to be adjusted for the most sensitive IT-hardware in the data center or the computer system even if the function of other components is ensured at higher temperatures or higher humidity levels. This leads to increasing costs for the air supply of data centers or computer systems.

In order to reduce the costs for the air supply, in-row-coolers are used. In-row coolers are arranged in the rows of the racks of a data center and between the racks. The in-row-coolers take warm air from a first side of the rows, for example the back side of the rows, and supply cooled air at a second side of the rows, for example the front side. The cooled air flows to the air inlet side of the computer systems and cools the computer components in the computer systems. The in-row-coolers take the warm air flowing out of the computer system so that a recirculated air operation for this row or a defined section of the data center is established. Further, it is common practice to use hot/cold aisle containments, by which the aisles containing warm or cold air are physically separated from one another to avoid mixing of cold and hot air. The air exchange between the circulated air of this section and other sections of the data center is very low so that an individual adjustment of the temperature and the relative humidity for a defined section of the data center is possible.

The in-row coolers can also provide dehumidification of the air to ensure correct operation of the computer systems. The temperature of the air is lowered below the dew-point so that the humidity is removed as condensate in the in-row coolers. The condensed water has to be collected and disposed. Furthermore, a low temperature of the in-row coolers is required to achieve the condensation process, which may lead to increasing costs of operation.

SUMMARY

According to an embodiment of the invention, an air moisture control system for a computer system is provided. The air moisture control system comprises a housing. The housing comprises an air and an air moisture control element with an adsorption material. The air moisture control element is exposed in the air passage so as to enable fluid communication toward and from the air moisture control element. The air moisture control system is designed such that the adsorption material is adapted to: adsorb moisture from a first air flow flowing in the air passage wherein the first air flow has a first temperature and a first relative humidity; desorb moisture to a second air flow flowing in the air passage, wherein the second air flow has a second temperature and a second humidity. The second temperature is at least 5° C. higher than the first temperature and the second relative humidity is at least 3% lower than the first relative humidity.

In a further aspect of the invention, a computer system with at least one aforementioned air moisture control system is provided. The computer system comprises a case. The air passage is connected to the case of the computer system.

Furthermore, a method of moisture control for a computer system is provided. The computer system comprises an air moisture control system. The air moisture control system comprises a housing. The housing comprises an air passage; and an air moisture control element with an adsorption material. The air moisture control element is exposed in the air passage so as to enable fluid communication toward and from the air moisture control element. The method comprises:

flowing a first air flow in the air passage, the first air flow has a first temperature and a first relative humidity, for the adsorption material to adsorb moisture from the first air flow; and flowing a second air flow in the air passage, the second air flow has a second temperature and a second relative humidity, the second temperature being at least 5° C. higher than the first temperature and the second relative humidity being at least 3% lower than the first relative humidity, for the adsorption material to desorb moisture from the second air flow.

BRIEF DESCRIPTION OF THE DRAWINGS

In the following embodiments of the invention are explained in greater detail, by way of example only, making reference to the drawings in which.

DETAILED DESCRIPTION

Embodiments of the invention may have the advantage that an individual moisture control for a computer system stored in a data center or a section of a data center may be possible. Furthermore, the air moisture control systems may be retrofitted to existing data centers without any changes of the central air handler or other cooling systems. The moisture control is independent from the temperature control.

Furthermore, the moisture control system can be installed into existing computer systems in order to improve the humidity control of the computer system or a section of a data center.

Furthermore, the moisture control elements can be (at least partly) regenerated by drying the adsorption material in a simple and uncomplicated way, especially without removing or exchanging the moisture control elements. It is only required to cause an air flow along a second air flow path having a temperature which is at least 5° C. higher than the temperature flowing along the first air flow path and having a relative humidity which is at least 3% lower than the relative humidity of the air flowing along the first air flow path.

The air moisture control element may comprise a heating element thermally coupled to the adsorption material. This may have the advantage that an improved heating of the moisture stored in the moisture control element may be possible. For example, the heating element is directly coupled to the adsorption material.

The heating element may be a heat exchanging element, especially a heat exchanging element using a fluid, in particular water. This may have the advantage that an additional temperature control can be provided by the heating elements. In particular, the water flowing through the heat exchanging element may be heated using heat dissipated from the computer system.

A first air flow path and a second air flow path may be defined in the air passage, respectively for the first air flow and the second air flow. The first air flow path and the second air flow path may extend from a first inlet and a second inlet, respectively, up to a first outlet and a second outlet, respectively. The air flow may flow along the first air flow path into the air passage at the first temperature of the air flow and the first relative humidity of the air flow. Furthermore, the air flow may flow along the second air flow path into the air passage having the second temperature and the second relative humidity. This may provide an improved moisture control. For example, the second outlet can be connected to the outside environment of the moisture control element in order to lead the air flowing along the second air flow path to the outside environment.

The first air flow path and the second air flow path may be configured such that the first air flow has a direction opposite to that of the second air flow, at the adsorption material. Therefore, a switchover between the adsorption process and a desorption process is possible by a reversal of the air flow direction.

The first outlet may be the second inlet. Since the first outlet and the second inlet may be in connection with the case of a computer system, only one opening in the computer system has to be provided.

The air moisture control system may further comprise a fan, configured for enabling the first air flow and the second air flow along the first and the second air flow path, respectively. Therefore, the fan is adapted for causing an air flow along both air flow paths.

The air moisture control system may comprise a first fan and a second fan. The first fan and the second fan may be configured for enabling the first air flow and the second air flow, along the first air flow path and the second air flow path, respectively. This may enable an improved control of the air flow along the air flow paths.

The housing may comprise two or more air moisture control elements with respective adsorption materials therein, each of the two or more air moisture control elements and their respective adsorption materials are configured as the before mentioned air moisture control element and the before mentioned adsorption material.

The air moisture control system may further comprise an air flow control device configured for defining the first air flow path and the second air flow path, the second air flow path distinct from the first air flow path. This may have the advantage that an improved airflow along the first and the second air flow path is possible. For example, the air flow control device may comprise a flap or a valve. The flap or valve may be arranged at an inlet or an outlet. The flap or the valve may be adapted for controlling the air flow through the inlet or the outlet and defining the first or the second air flow path.

The adsorption material may comprise at least one of:
a porous silica;
a zeolites;
an aluminophosphates;
a metal-organic frameworks; and
a porous carbon In the computer system a first air flow path and a second air may be defined in the air passage such that the first air flow path and the second air flow path extend from a first inlet and a second inlet, respectively, up to a first outlet and a second outlet, respectively. The air moisture control element may be exposed in the air passage so as to enable fluid communication with each of: the first air flow in the first air flow path and the second air flow in the second air flow path. The first air flow flows in the air passage at a first temperature and a first relative humidity. The second air flow flows in the air passage at a second temperature and a second relative humidity. The first outlet and the second are connected to the case and the first inlet and the second outlet are connected to the outside environment of the case of the computer system.

At flowing the second air flow, the adsorption material may be heated by the second air flow. This may have the advantage that an additional heating is not required.

Alternatively or in addition, at flowing the second air flow, the adsorption material may be heated by a heating element. This may lead to an improved heating of the adsorption material and a faster drying process of the air moisture control element.

The method may further comprise estimating a temperature difference between the temperature of the adsorption material and the first temperature. A switching over from the step of flowing the first air flow to the step of flowing the second air flow is performed based on the estimated temperature difference.

The method may further comprise measuring the moisture content of the adsorption material. A switching over from the step of flowing the first air flow to the step of flowing the second air flow is performed based on the measured moisture content.

The method may further comprise estimating a relative humidity difference between a relative humidity of the adsorption material and the first relative humidity. A switching over from the step of flowing the first air flow to the step of flowing the second air flow is performed based on the estimated relative humidity difference.

The first relative humidity may be between 30% and 60%, and the first temperature may be between 15° C. and 35° C. The initial relative humidity of the air flow may be higher until dehumidification has taken place for the first time.

Hereinafter, a computer system 12, a moisture control system 10 and a method for moisture control of the computer system 12 are described with respect to FIGS. 1 to 4.

The computer system 12 comprises a moisture control system 10. The computer system 12 may be a server rack which comprises various computer components 14. The computer system 12 comprises a case 20 in which the computer components 14 can be stored. For example, the case 20 is a 19-inch-rack for computer components 14 as it is used in a data center 16 shown in FIG. 5 for fast insertion and removal of computer components 14.

The case 20 comprises a front wall 24, a back wall 22, two side walls 26 and a top cover 28. The front wall 24 and the back wall 22 are open so that air can flow through the computer system 12 for cooling the computer components 14. For example the front wall 24 and the back wall 22 are perforated. The top cover 28 has an opening 30 in order to establish a connection to the moisture control system 10 which is arranged on top of the case 20 and which is described below in detail.

Figure 5:
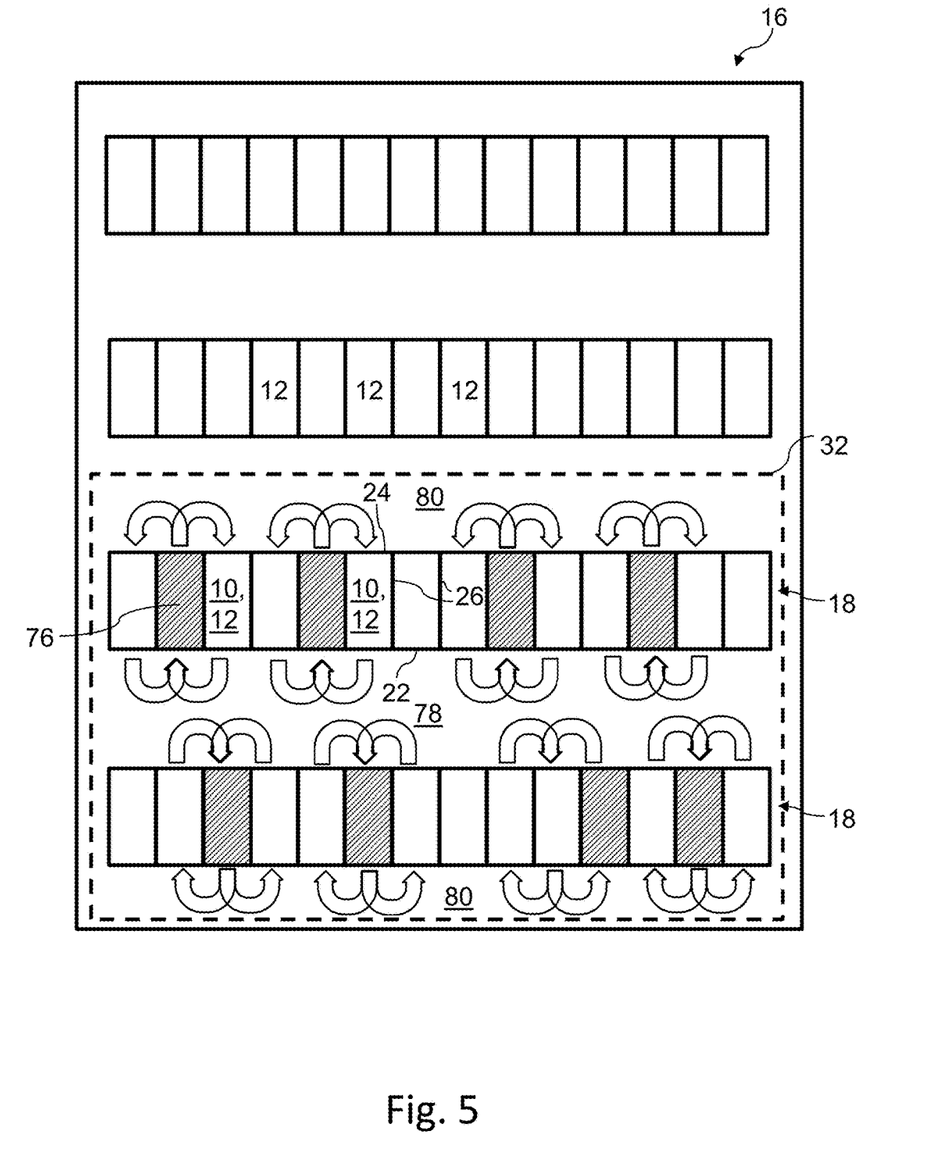
FIG. 5 shows a data enter comprising computer systems of FIGS. 1 and 3.

The computer system 12 may be arranged in a section 32 of a data center 16 as shown in FIG. 5. This section 32 of the data center 16 comprises various computer systems 12 which are arranged in rows 18. The data center 16 may comprise various other sections comprising various further computer-systems 12.

Figure 6:
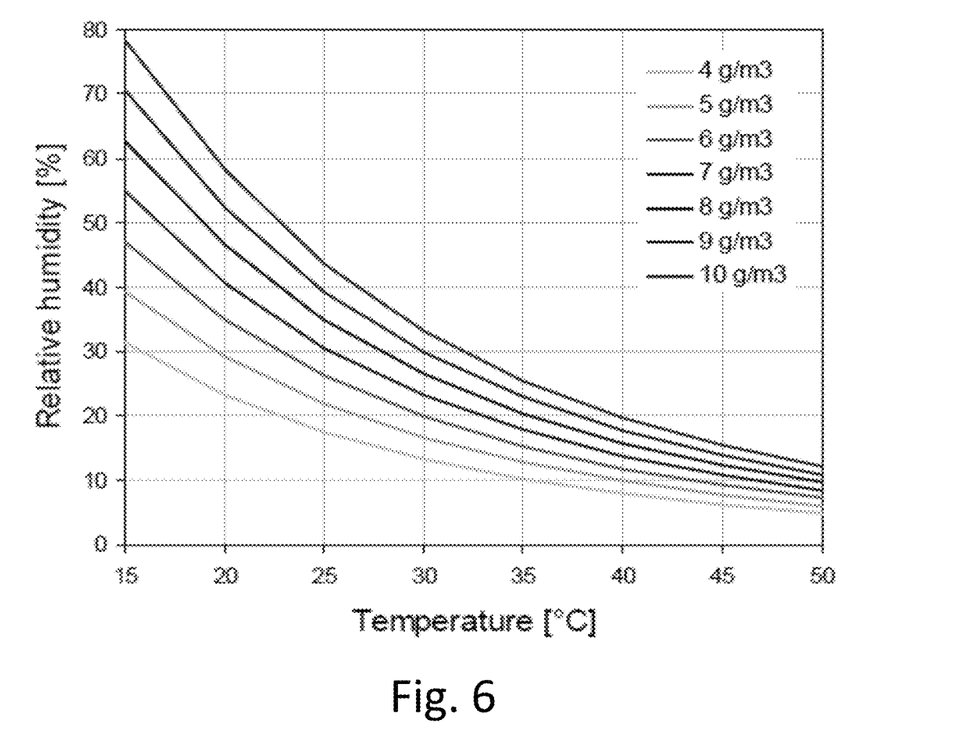
FIG. 6 shows a diagram of the relative humidity dependent on the air temperature for various absolute humidities.

The data center 16 operates with recirculated air. The humidity which can be stored in cooled air is lower than the humidity which can be stored in warm air (see diagram in FIG. 6). Since the absolute humidity is constant, the relative humidity increases with falling temperature. If the relative humidity increases to 100%, condensation on the computer components 14 will occur. This can lead to malfunctions of the computer components 14. Therefore, the relative humidity must be kept below 100% to prevent condensation. Further, it is known that a reliable operation of computer systems requires to maintain the relative humidity in a data center below a certain threshold value. For example, the American Society of Heating, Refrigerating, and Air-Conditioning Engineers (ASHRAE) recommends to keep the relative humidity of data centers below 60%. A global control of the temperature and the relative humidity may be provided by a central air cooler.

The temperatures required by the computer systems 12 may differ. Some computer systems 12 require less or at least no cooling whereas other computer systems 12 require a strictly controlled temperature and relative humidity.

Computer systems 12 which require lower temperatures may be arranged in the section 32 of the data center 16 which is shown in FIG. 5. This section 32 comprises in-row-coolers 76. As described below, the in-row coolers 76 are adapted to supply the computer system 12 stored in this section 32 with air having lower temperature. An adjustment of the temperature and the humidity of the entire data center 16 for the most sensitive computer system 12 stored in the data center 16 is not required.

The in-row-coolers 76 are arranged in the rows 18 and between the racks of the computer systems 12. The in-row-coolers 76 take warm air $T_H$ from a first side of the rows, for example the back side 78 of the rows 18, and supply cooled air $T_C$ at a second side of the rows, for example the front side 80. The cooled air $T_C$ flows from the front side 80 of the rows 18 through the computer systems 12 to the back side 78 and cools the computer components 14 in the computer systems 12.

Since the in-row-coolers 76 take the warm air $T_H$ flowing out of the computer systems 12, the in-row-coolers 76 establish a recirculated air operation for this row. The air exchange between the circulated air and other section of the data center 16 is very low so that an individual adjustment of the temperature and the relative humidity of this row 18 or a section 32 of the data center 16 is possible.

The computer systems 12 stored in the section 32 are each equipped with a moisture control system 10. The relative humidity of the air and optionally the temperature of the air can be adjusted individually for each computer system 12 using the moisture control system 10. The circulated air is sucked through the moisture control system 10 and provided as dry air to the respective computer system 12. Since the air is constantly circulated from the in-row-cooler 76 to the moisture control system 10, from the moisture control system 10 to the computer system 12 and from the computer system 12 back to the in-row-cooler 76, drying of air is possible with very high efficiency.

The computer system 12 can be retrofitted to existing data centers. Furthermore, the moisture control system 10 can be installed into existing computer systems 12 in order to improve the humidity control of the computer system 12.

Hereinafter, the moisture control system 10 is described in details with respect to FIGS. 2 and 4.

The moisture control system 10 is arranged on top of the case 20 in order to not limit the available space for computer components 14 in the case 20.

For example, the moisture control system 10 may be inserted into the case 20. For example, the moisture control system 10 is designed to be inserted into the computer system 10 in the same way as a computer component 14.

For example, the air moisture control system 10 can be arranged at any location where a fluid communication of an air flow can be established between the moisture control system 10 and the computer system 12.

The air moisture control system 10 comprises a housing 40 with a back side 42, a front side 44, a base plate 46, a cover 48 and two side walls 50. An air passage 52 is defined in the housing 40.

The housing 40 comprises three openings 54, 56, 58. The first opening 54 is located at the back side 42. The second opening 56 is located at the base plate 46. The second opening 56 is positioned on top of the opening 30 of the top cover 28 of the case 20. The third opening 58 is located at the cover 48. A dehumidification duct 60 is arranged at the third opening 58 which establishes a flow connection from the air passage 52 to an outside environment of the case 20 of the computer system 12, especially the outside environment of the data center 16.

Figure 2:
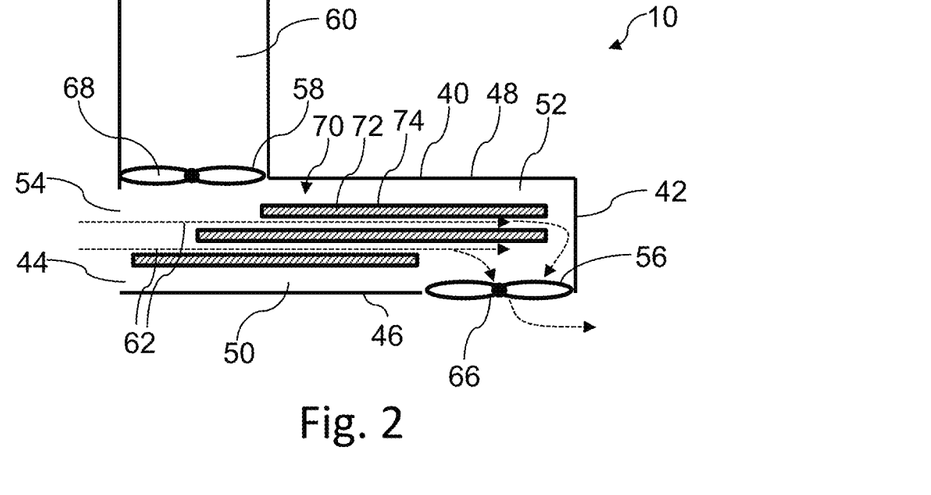
FIG. 2 shows a detailed view of the moisture control system of the computer system shown in FIG. 1.

A first air flow path 62 is defined in the housing 40 extending from the first opening 54 through the air passage 52 up to the second opening 56 (see FIG. 2). The first opening 54 defines a first inlet for the first air flow path 62; the second opening 56 defines a first outlet for the first air flow path 62.

A second air flow path 64 is defined in the housing 40 extending from the second opening 56 through the air passage 52 up to the third opening 58 (see FIG. 2). The second opening 56 defines a second inlet for the second air flow path 64. The third opening 58 defines a second outlet for the second air flow path 64.

Figure 4:
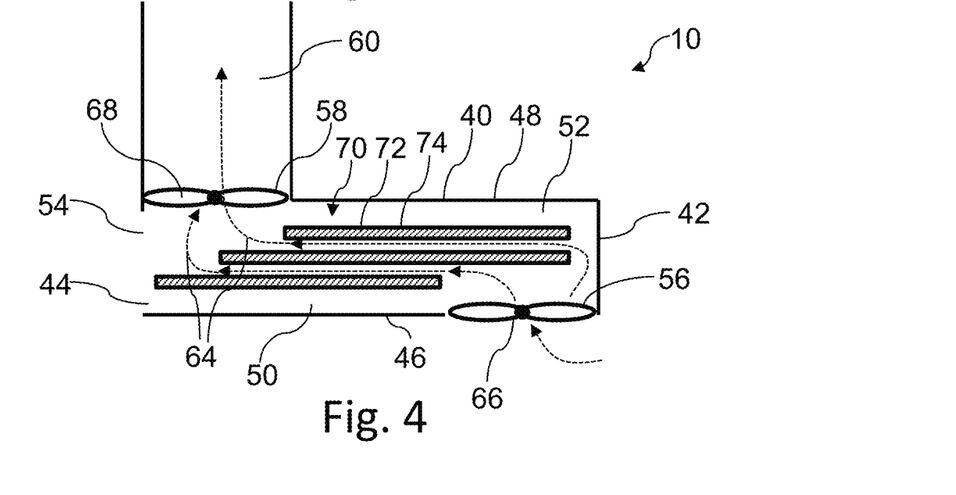
FIG. 4 shows a detailed view of the moisture control system of the computer system shown in FIG. 1.

As can be seen in FIGS. 2 and 4, the first outlet corresponds to the second inlet.

A first fan 66 is arranged at the first outlet of the first air flow path 62 respectively the second inlet of the second air flow path 64. A second fan 68 is arranged at the second outlet of the second air flow path 64. The first fan 66 is configured for enabling a first air flow along the first air flow path 62 and a second air flow along the second air flow path 64 depending on the rotation direction of the fan 66. The second fan 68 is configured for enabling a second air flow along the second air flow path 64.

As can be seen in FIGS. 2 and 4, moisture control elements 70 are exposed in the air passage 52 and thus in the first air flow path 62 and the second air flow path 64. Each moisture control element 70 comprises a heat exchanging element 72. The heat exchanging elements 72 may comprise ducts for a cooling liquid for a temperature control of the heat exchanging elements 72 and thus of the moisture control elements 70.

Furthermore, each moisture control element 70 comprises an adsorption material 74 applied to the heat exchanging elements 72 and thermally coupled to the heat exchanging elements 72. For example, the heat exchanging elements 72 are coated with the adsorption material 74.

The adsorption material 74 is adapted to adsorb moisture from the first air flow flowing along the adsorption material having a first temperature and a first relative humidity. Therefore, the adsorption material is adapted for drying air with a first temperature and a first humidity.

Furthermore, the adsorption material 74 is adapted to desorb moisture to the second air flow flowing at the adsorption material with a second temperature $T_H$ and a second relative humidity $RH_H$, wherein the second temperature $T_H$ is higher than the first temperature $T_C$ and the second humidity $RH_H$ is lower than the first humidity $RH_C$. Preferably, the second temperature $T_H$ is at least 5° C. higher than the first temperature $T_C$ and the second relative humidity $RH_H$ is at least 3% lower than the first relative humidity $RH_C$.

The adsorption material 74 may comprise at least one of the following materials:
 a porous silica
 a zeolites
 an aluminophosphates
 a metal-organic frameworks
 a porous carbon.

For example, several adsorption materials 74 may be combined for an improved moisture management.

Due to the fact that each moisture control element 70 comprises a heat exchanging element 72, the moisture control elements 70 are not permeable to air so that the air flows at the surface of the moisture control element 70.

For example, the moisture control elements 70 may be permeable to air, so that the air can flow through the moisture control element 70. This leads to an enlarged surface of the adsorption material 74 for an improved moisture exchange.

For example, the moisture control elements 70 may not comprise heat exchanging elements 72.

For example, the moisture control elements 70 may comprise a support for the adsorption material 74.

The moisture control elements 70 are arranged in the air passage 52 so that the air flow flowing along the first air flow path 62 or the second air flow path 64 flows at the moisture control elements 70. As can be seen in FIGS. 2 and 4, the first air flow path 62 and the second air flow path 64 are configured such that the first air flow path 62 has a direction opposite to the second air flow path 64 at the adsorption material 74.

The first air flow path 62 and the second air flow path 64 are designed in serpentines in order to maximize the travel length of the air along the moisture control elements 70. However, the first air flow path 62 and the second air flow path 64 can be designed in any way in order to provide minimum pressure drop in the moisture control system 10 and/or to maximize the travel length along the moisture control elements 70.

A method for moisture control in a computer system 12 is now described with reference to FIGS. 1 to 4.

Figure 1:
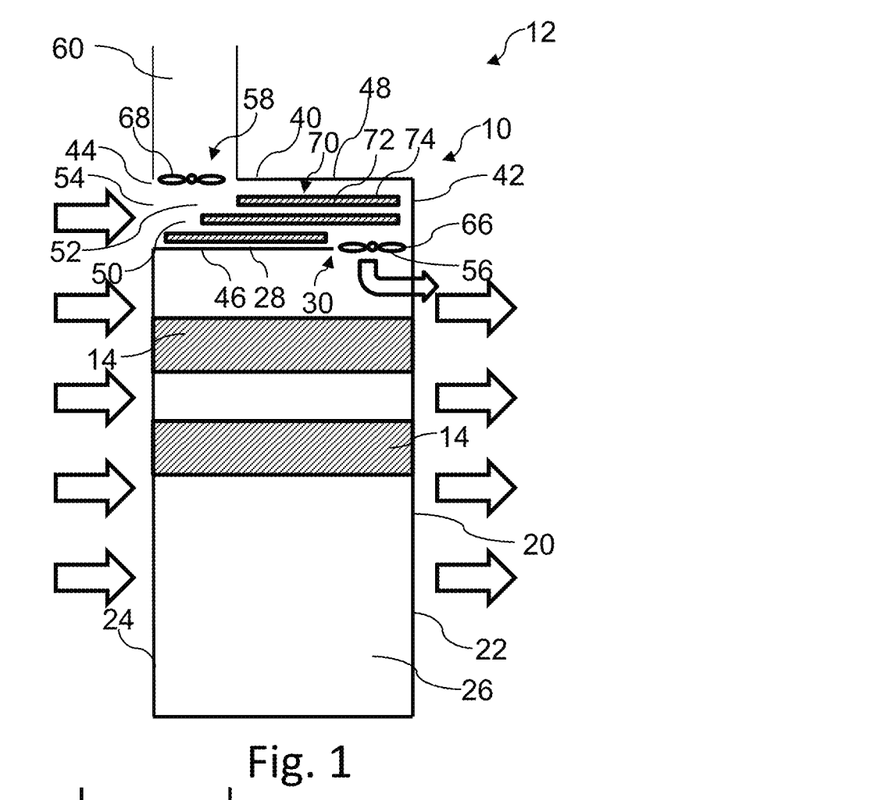
FIG. 1 shows a schematic illustration of a computer system, wherein the computer system is in a dehumidification phase.

For drying the air and lowering the relative humidity of the air flowing into the computer system 12, a first air flow is enabled along the first air flow path 62 by the first fan 66. The first air flow flows in the air passage 52 with a first temperature $T_C$ and a first relative humidity $RH_C$. For example, the first temperature $T_C$ is 20° C. and the first relative humidity $RH_C$ is 40%. Since the air may be cooled for example by the central air handler 32, the relative humidity of the air may be higher.

The first air flow flows along the first air flow path 62 and at the moisture control elements 70 to the first outlet of the first air flow path 62. The adsorption material 74 adsorbs moisture from the first air flow flowing at the moisture control elements 70 so that the relative humidity of the air flowing out of the first outlet into the computer system 12 is lowered. The moisture of the air is adsorbed by the adsorption material 74 and stored in it. Thereby, a condensation of moisture on the computer components 14 is prevented.

Since the section 32 of the data center 16 comprising in-row-coolers 76 and moisture-control systems 10 operates with circulated air, an almost complete drying of the air is possible. A further moisture adsorption is only required if fresh humid air is flowing into the data center 16 or to the section 32 of the data center 16.

When the air is completely dried or the adsorption capacity of the adsorption material 74 is reached, a regeneration of the adsorption material 74 may be made by drying the adsorption material 74.

Figure 3:
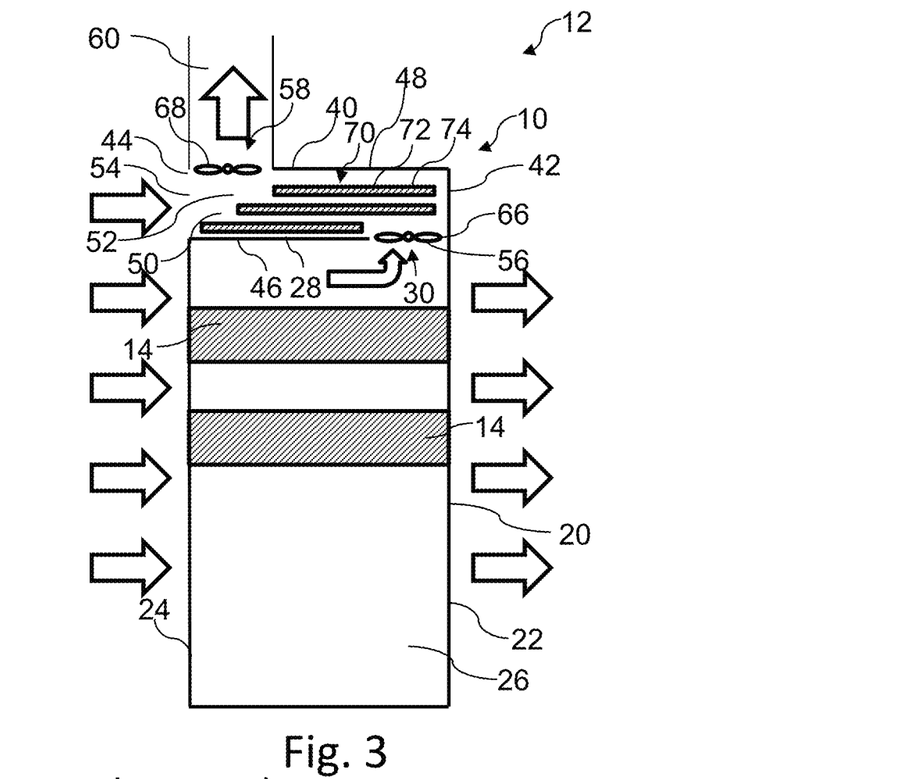
FIG. 3 shows a schematic illustration of a computer system, wherein the computer system is in a regeneration phase.

For a regeneration of the adsorption material 74, a second air flow along the second air flow path is enabled by the first fan 66 and the second fan 68. For example, it is possible that the second air flow along the second air flow path 64 is enabled only by the second fan 68. The air flows from the second inlet through the air passage to the second outlet.

For desorbing moisture to the air, two requirements must be fulfilled: The second temperature $T_H$ of the incoming air and/or the adsorption material 74 must be higher than the first temperature $T_C$, and the second relative humidity $RH_H$ must be equal to or lower than the first relative humidity $RH_C$. If these conditions are fulfilled, the adsorption material 74 desorbs moisture to the air in a very efficient manner. Preferably, the second temperature $T_H$ is at least 5° C. higher than the first temperature $T_C$ and the second relative humidity $RH_H$ is at least 3% lower than the first relative humidity $RH_C$.

The regeneration process is carried out in case the moisture of the moisture control elements 70 increases above a defined value. During regeneration, the air flows through the second outlet and the humidification duct to the outside environmental of the data center, the moisture is removed from the data center 16.

The air flowing out of the data center 16 has to be replaced by fresh air flowing into the data center. Since the volume of the inflowing air is low compared to the volume of the data center 16 or the section 32 of the data center 16, the increase of the relative humidity in the data center caused by the inflowing air is low. The newly brought in humidity may be adsorbed during a following adsorption period of the moisture control system 10.

Since the relative humidity in the data center 16 is lowered, the humidity which has to be adsorbed by the moisture control system 10 during the next adsorption period is lower. Therefore, the next regeneration process may be carried out in a shorter time period so that less air has to be replaced by fresh air and less humidity is brought into the data center 16.

The moisture in the adsorption material 74 may be heated to the second temperature $T_H$ by the second air flow flowing along the second air flow path 64. The air flowing along the second air flow path 64 passes the computer system 12 and is therefore heated by the components 14 stored in the computer system 12. Therefore, an additional heating for the air may not be required.

Alternatively or in addition, the adsorption material 74 may be heated by a hot liquid flowing through the ducts of the heat exchanging elements 72 or an additional heating element.

Upon completion the regeneration process of the adsorption material 74 the air flow along the first air flow path can again be resumed for drying the cooled air.

A switching over from the step of flowing the first air flow to the step of flowing the second air flow and thus from drying the air to regenerate the adsorption material 74 may be controlled in different ways:

In a first alternative a temperature sensor is arranged at the adsorption material 74. The necessity of regeneration of the adsorption material 74 is detected by estimating the temperature difference between the temperature of the adsorption material 74 and the first temperature. For example, a temporal temperature profile of the adsorption material 74 is created. While the adsorption material 74 adsorbs moisture form the air, the temperature of the adsorption material 74 rises due to the exothermic nature of the process. If the adsorption material 74 cannot adsorb additional moisture, the temperature remains constant or rises slower. Therefore, a slower rising of the temperature or a constant temperature indicates the need of drying the adsorption material 74.

Since desorption of moisture from the adsorption material 74 is an endothermic process it slows down the heating of the adsorption material during regeneration, and the completion of the regeneration process can be detected similarly, depending on the characteristic of the temperature chance over the time.

In a second alternative, a humidity sensor is arranged at the adsorption material 74 and the moisture content of the adsorption material 74 is measured. Since the maximum moisture which can be adsorbed by the adsorption material 74 is known, the need of regeneration may be detected in an easy way.

In a third alternative, humidity sensors are arranged at the first and the second outlet. The relative humidity of the inflowing and outflowing air at the first respectively the second inlet and outlet is measured and a relative humidity difference is estimated. Since the adsorption material 74 adsorbs moisture from the air, the relative humidity of the inflowing air and the outflowing air must differ. If the adsorption material 74 cannot adsorb or desorb further moisture, the relative humidity of the inflowing air and the outflowing air become equal.

In a fourth alternative, the time periods for moisture adsorption and regeneration of the adsorption material 74 are calculated depending on the actual relative humidity and the temperature of the air as well as the mass and the adsorption capacity of the adsorption material 74.

The mass of the moisture adsorption material may be calculated depending on the temperature and the relative humidity of the air flowing into the data center and the volume of the data center 16.

In the following it is assumed that the volume of the data center 16 is 20 m$^3$. The temperature $T_C$ of the first air flow may be 20° C. and the relative humidity $RH_C$ may be 40%. The second temperature $T_H$ may be 10° C. higher. The adsorption material may be porous silica with an adsorption capacity of 0.23 kg$_{H2O}$/kg$_{ads}$ under the operating conditions of this example. It is assumed that the data center 16 operates with recirculated air.

Since the absolute humidity of air having a temperature $T_C$ of 20° C. and a relative humidity $RH_C$ of 40% is 6.9 g/m$^3$ (see FIG. 6), the air in the data center 16 contains a total of 132 g water. The mass of the adsorption material 74 required for a complete dehumidification is thus 0.57 kg.

Figure 7:
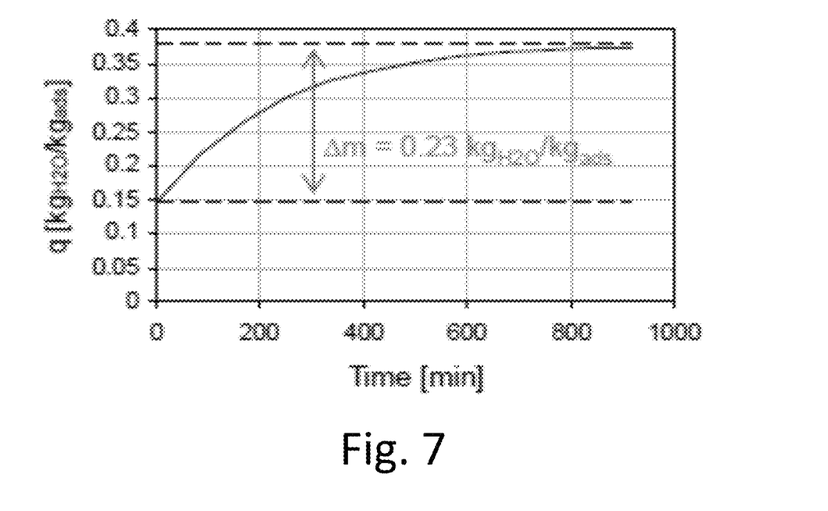
FIG. 7 shows a diagram of the adsorption dynamic of the adsorption material of the moisture control element of the moisture control system of FIGS. 2 and 4.

FIG. 7 shows the time dependency of the mass of the adsorption material on time during the adsorption process. Since the adsorption capacity under the operating conditions of this example is 0.23 kg$_{H2O}$/kg$_{ads}$, the maximum increase of mass of the adsorption material is 0.23 kg/kg$_{ads}$. As can be seen in FIG. 7, the speed of adsorption decreases when the adsorption material 74 reaches the maximum weight respectively when the adsorption material 74 reaches saturation. The maximum weight respectively saturation of the adsorption material under the above mentioned conditions is approximately reached after 1000 minutes.

After this time, a switching over may be automatically made to the second air flow and thus to the drying process. To increase the rate of dehumidification of the first air flow, the switchover may also be made at an earlier time.

Figure 8:
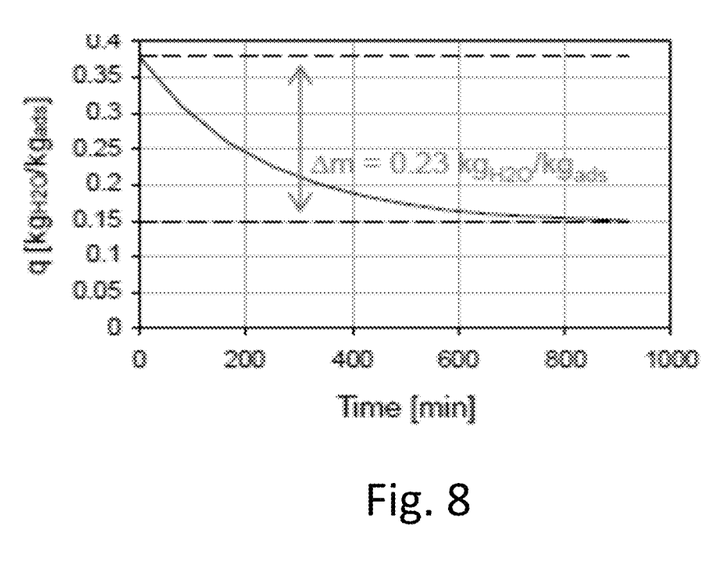
FIG. 8 shows a diagram of the desorption dynamic of the adsorption material of the moisture control element of the moisture control system of FIGS. 2 and 4.

The desorption process of the adsorption material 74 is shown in FIG. 8. The moisture stored in the adsorption material 74 is heated and desorbs. Thereby, the weight of the adsorption material 74 and moisture stored therein decreases until the adsorption material 74 is dried to a predefined level. Since the humidity of the air is completely stored in the adsorption material 74, the lowest second relative humidity $RH_H$ of the air that can be reached in this operation example is approximately 0%. Furthermore, it is assumed that the second temperature $T_H$ of the air is 10° C. higher than the first temperature $T_C$. Since fresh air has to be brought into the data center or the section in order to replace the air flowing out of the data center through the dehumidification duct 60, the relative humidity may increase slightly during the regeneration process. Since the volume of fresh air is low compared with the volume of the data center, the increase of the relative humidity is low. Under these conditions, a complete drying of the adsorption material 74 is approximately reached after 1000 minutes.

Since the speed of adsorption decreases when the relative moisture of the adsorption material 74 reaches 100% (see FIG. 7), a switchover to the drying process may be made automatically well before the adsorption capacity is reached.

Similarly, the drying process may be stopped at a defined residual moisture of the adsorption material 74.

The mass of the adsorption material 74 may be selected such that the humidification process and the regeneration process may be performed in a shorter time period. Furthermore, the mass of the adsorption material may be selected larger in order to ensure a complete humidification in case of changing conditions of the humidity or the temperature, for example a higher relative humidity $RH_C$ or a lower second temperature $T_H$.

Even though the temperature in the data center 16 is controlled by the in-row-coolers 76, an additional temperature control can be provided by the heat exchanging elements. For example the moisture control element 70 can be heated during the regeneration process in order to improve the speed of the regeneration process or additionally cooled during the humidification process.

In FIGS. 1 to 4, a switching over from the first air flow flowing along the first air flow path 62 and the second air flow flowing along the second air flow path 64 is enabled by the fans 66, 68. If an air flow along the second air flow path 64 is enabled, air may flow from the first inlet directly to the second outlet. However, since the second air flow flowing along the second air flow path 64 is caused in addition by the first fan 66, the air flow along the second air flow path 64 and therefore the regeneration of the adsorption material 74 is ensured.

For example, additional air flow control devices such as flaps or valves may be arranged in the housing 40, configured for defining and controlling the first air flow path 62 and the second air flow path 64. Preferably, the flaps or valves are arranged at the inlets or outlets of the first or the second air flow paths 62, 64. For example a flap may be arranged at the opening 54 in order to close the opening 54 during the regeneration process. Alternatively or additionally a flap may be arranged at the third opening 58 which may be closed during the humidification process in order to prevent an inflow of air through the dehumidification duct 60.

The computer system 12, the moisture control system 10 and the described method provide a local humidity control so that an individual humidity control for a section 32 of a data center 16 may be provided. The humidity control may be independent from the temperature control of the data center 16 or the computer system 12. Therefore a computer system 12 as described above can be installed into existing data centers 16 or sections 32 of a data center 16 which operate with circulated air. Furthermore, the moisture control systems 10 according to the invention can be adapted to any computer system 12 in such a data center 16 or section 32. It is only required that the air moisture control system 10 is arranged so that the circulated air flows partly through the air moisture control system 10.

The housing 40 of the moisture control system 10 shown in FIGS. 2 and 4 comprises three openings 54, 56, 58 which define the first and the second inlet and the first and the second outlet. However, other embodiments of the moisture control system 10 are possible, especially with different designs of the housing 40, the air passage 52 and the moisture control elements 70.

For example, the housing 40 may comprise separate openings for the first air flow path 62 and the second air flow path 64. Alternatively, the first air flow path 62 and the second air flow path 64 use the same openings. Furthermore, the first air flow path 62 and the second air flow path 64 may be guided in the same direction along the moisture control element 70.

Alternatively to the data center 16 shown in FIG. 5 the computer system 12 can be arranged in any data center 16. Furthermore, the computer system 12 can be arranged in a separate room.

The description of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others ordinary skilled in the art to understand the embodiments disclosed herein.

What is claimed is:

1. A method of moisture control for a computer system comprising an air moisture control system, the air moisture control system in turn comprising a housing that defines an air passage; at least one fan for causing an air flow through the air passage; and an air moisture control element with an adsorption material, the air moisture control element exposed in the air passage so as to enable fluid communication toward and from the air moisture control element, the method comprising:
    flowing a first air flow in the air passage by operation of the at least one fan, said first air flow having a first temperature and a first relative humidity, for the adsorption material to adsorb moisture from the first air flow;
    changing operation of the at least one fan to switch over from flowing the first air flow in the air passage to flowing a second air flow in the air passage; and
    flowing the second air flow in the air passage by operation of the at least one fan, said air flow having a second temperature and a second relative humidity, the second temperature being at least 5° C. higher than the first temperature and the second relative humidity being at least 3% lower than the first relative humidity, for the adsorption material to desorb moisture to the second air flow.

2. The method of claim 1, wherein, at flowing the second air flow, the adsorption material is heated by the second air flow.

3. The method of claim 2, wherein the first relative humidity is between 30% and 60%, and the first temperature is between 15° C. and 35° C.

4. The method of claim 1, wherein, at flowing the second air flow, the adsorption material is heated by a heating element.

5. The method of claim 1, further comprising: estimating a temperature difference between the temperature of the adsorption material and the first temperature, and wherein switching over from the step of flowing the first air flow to the step of flowing the second air flow is performed based on the estimated temperature difference.

6. The method of claim 1, further comprising measuring the moisture content of the adsorption material, and wherein switching over from the step of flowing the first air flow to the step of flowing the second air flow is performed based on the measured moisture content.

7. The method of claim 1, further comprising: estimating a relative humidity difference between a relative humidity of the adsorption material and the first relative humidity, and wherein switching over from the step of flowing the first air flow to the step of flowing the second air flow is performed based on the estimated relative humidity difference.

* * * * *